(12) United States Patent
Urushido

(10) Patent No.: US 7,057,267 B2
(45) Date of Patent: Jun. 6, 2006

(54) SEMICONDUCTOR DEVICE AND METHOD OF FABRICATION THEREOF, ELECTRONIC MODULE, AND ELECTRONIC INSTRUMENT

(75) Inventor: Tatsuhiro Urushido, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/996,471

(22) Filed: Nov. 26, 2004

(65) Prior Publication Data

US 2005/0127467 A1    Jun. 16, 2005

(30) Foreign Application Priority Data

Nov. 28, 2003   (JP)   ............................. 2003-399137

(51) Int. Cl.
*H01L 23/496* (2006.01)

(52) U.S. Cl. ...................... 257/666; 257/668; 257/672; 257/676

(58) Field of Classification Search ........ 257/667–677, 257/692–696, 666, 690, E23.031, E23.059; 438/123, 111–112, FOR. 367, FOR. 377, 438/FOR. 380; 428/643–685
See application file for complete search history.

(56) References Cited

U.S. PATENT DOCUMENTS

6,037,667 A * 3/2000 Hembree et al. ........... 257/779
6,476,456 B1 * 11/2002 Boden, Jr. .................. 257/486
6,605,523 B1   8/2003 Takano

FOREIGN PATENT DOCUMENTS

JP    A 2001-326423    11/2001
JP    A 2004-274007     9/2004

OTHER PUBLICATIONS

U.S. Appl. No. 10/996,472, filed Nov. 26, 2004, Urushido.
U.S. Appl. No. 10/994,403, filed Nov. 23, 2004, Urushido.

* cited by examiner

*Primary Examiner*—Jasmine Clark
(74) *Attorney, Agent, or Firm*—Oliff & Berridge, PLC

(57) ABSTRACT

A semiconductor device includes a substrate on which are formed a first group and a second group of leads; and a semiconductor chip having a first group and a second group of electrodes, the first group and a second group of electrodes being arranged respectively on both sides of a region between first and second straight lines, the first and second straight lines being parallel to each other. The semiconductor chip is mounted on the substrate so that the first group of electrodes faces the first group of leads and the second group of electrodes faces the second group of leads. Each of the second group of leads has a bent portion, the bent portion being formed so that a contour of an inner side of each bend of the bent portion draws a curve.

6 Claims, 4 Drawing Sheets

SEMICONDUCTOR DEVICE AND METHOD OF FABRICATION THEREOF, ELECTRONIC MODULE, AND ELECTRONIC INSTRUMENT

Japanese Patent Application No. 2003-399137, filed on Nov. 28, 2003, is hereby incorporated by reference in its entirety.

BACKGROUND OF THE INVENTION

The present invention relates to a semiconductor device, a method of fabrication thereof, an electronic module, and an electronic instrument.

In chip-on-film (COF) packaging, a semiconductor chip is mounted on a substrate. Since the substrate and the semiconductor chip have different coefficients of thermal expansion, stress is generated in connective portions between leads formed on the substrate and electrodes of the semiconductor chip. Since fine leads are easily broken by stress, it is required to prevent such a situation.

BRIEF SUMMARY OF THE INVENTION

According to a first aspect of the present invention, there is provided a semiconductor device comprising:

a substrate on which are formed a first group and a second group of leads; and a semiconductor chip having a first group and a second group of electrodes, the first group and the second group of electrodes being arranged respectively on both sides of a region between first and second straight lines, the first and second straight lines being parallel to each other, wherein the semiconductor chip is mounted on the substrate so that the first group of electrodes faces the first group of leads and the second group of electrodes faces the second group of leads, and wherein each of the second group of leads has a bent portion, the bent portion being formed so that a contour of an inner side of each of the bent portion draws a curve.

According to a second aspect of the present invention, there is provided an electronic module to which is attached the above described semiconductor device.

According to a third aspect of the present invention, there is provided an electronic instrument having the above described semiconductor device.

According to a fourth aspect of the present invention, there is provided a method of fabricating a semiconductor device, comprising:

(a) heating and expanding a substrate on which first and second groups of leads are formed and a semiconductor chip which includes first and second groups of electrodes arranged respectively on both sides of a region between first and second parallel straight lines;

(b) bonding each of the first group of electrodes to one of the first group of leads, and bonding each of the second group of electrodes to a first portion of one of the second group of leads; and (c) causing the semiconductor chip and the substrate to release heat and shrink, wherein, before the step (b), each of the second group of leads further includes a bent portion extending from the first portion and a second portion extending from the bent portion, the bent portion is formed so that a contour of an inner side of each bend of the bent portion draws a curve, and at least the second portion adhering to the substrate, wherein the step (c) includes:

($c_1$) causing the semiconductor chip to shrink at a percentage greater than a percentage of the substrate, and causing the bent portion to be deformed by applying force in a shrinkage direction to the bent portion through the first portion bonded to one of the second group of electrodes by the shrinkage force; and ($c_2$) causing the substrate to shrink at a percentage greater than a percentage of the semiconductor chip, and causing the bent portion to be deformed by applying force in a shrinkage direction to the second portion adhering to the substrate by the shrinkage force.

DETAILED DESCRIPTION OF THE EMBODIMENTS

Figure 1:
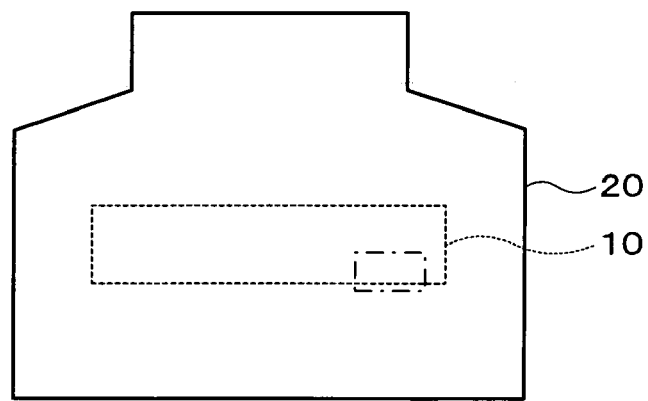
FIG. 1 is illustrative of a semiconductor device in accordance with one embodiment of the present invention.

An objective of embodiments of the present invention is to prevent the breakage of leads.

(1) According to one embodiment of the present invention, there is provided a semiconductor device comprising:

a substrate on which are formed a first group and a second group of leads; and a semiconductor chip having a first group and a second group of electrodes, the first group and a second group of electrodes being arranged respectively on both sides of a region between first and second straight lines, the first and second straight lines being parallel to each other, wherein the semiconductor chip is mounted on the substrate so that the first group of electrodes faces the first group of leads and the second group of electrodes faces the second group of leads, and wherein each of the second group of leads has a bent portion, the bent portion being formed so that a contour of an inner side of each bend of the bent portion draws a curve.

According to this embodiment, since each of the second group of leads is bent, the bent portion is more easily bent.

However, since the bent portion has a contour of the inner side of each bend thereof that draws a curve, a stress does not easily concentrate on one portion, making it even more possible to prevent breakages.

(2) In the semiconductor device, the bent portion may be formed so that a contour of an outer side of each bend of the bent portion draws an angle.

(3) In the semiconductor device, the bent portion may be formed between straight portions, and the bent portion may comprise a wide portion which is wider than the width of the straight portions.

(4) In the semiconductor device, a contour of the wide portion may comprise the angle.

(5) In the semiconductor device, the first group of leads may be drawn out in a direction extending away from the second group of electrodes, each of the second group of leads may be drawn out so as to pass between the first group of electrodes, and the bent portion may be positioned in the region between the first and second straight lines.

(6) According to another embodiment of the present invention, there is provided an electronic module to which is attached the above described semiconductor device.

(7) According to a further embodiment of the present invention, there is provided an electronic instrument having the above described semiconductor device.

(8) According to still another embodiment of the present invention, there is provided a method of fabricating a semiconductor device, comprising:

(a) heating and expanding a substrate on which first and second groups of leads are formed and a semiconductor chip which includes first and second groups of electrodes arranged respectively on both sides of a region between first and second parallel straight lines;

(b) bonding each of the first group of electrodes to one of the first group of leads, and bonding each of the second group of electrodes to a first portion of one of the second group of leads; and (c) causing the semiconductor chip and the substrate to release heat and shrink, wherein, before the step (b), each of the second group of leads further includes a bent portion extending from the first portion and a second portion extending from the bent portion, the bent portion is formed so that a contour of an inner side of each bend of the bent portion draws a curve, and at least the second portion adhering to the substrate;

wherein the step (c) includes:

($c_1$) causing the semiconductor chip to shrink at a percentage greater than a percentage of the substrate, and causing the bent portion to be deformed by applying force in a shrinkage direction to the bent portion through the first portion bonded to one of the second group of electrodes by the shrinkage force; and ($c_2$) causing the substrate to shrink at a percentage greater than a percentage of the semiconductor chip, and causing the bent portion to be deformed by applying force in a shrinkage direction to the second portion adhering to the substrate by the shrinkage force.

According to this embodiment, since each of the second group of leads is bent, the bent portion is more easily bent. However, since the bent portion has a contour of the inner side of each bend thereof that draws a curve, a stress does not easily concentrate on one portion, making it even more possible to prevent breakages.

(9) In the method of fabricating a semiconductor device may comprise:

mounting the semiconductor chip over the substrate in the step (b) so that a gap is formed between the semiconductor chip and the substrate; and filling an underfill material between the semiconductor chip and the substrate after the step (b).

Embodiments of the present invention are described below with reference to the accompanying figures.

Figure 2A:
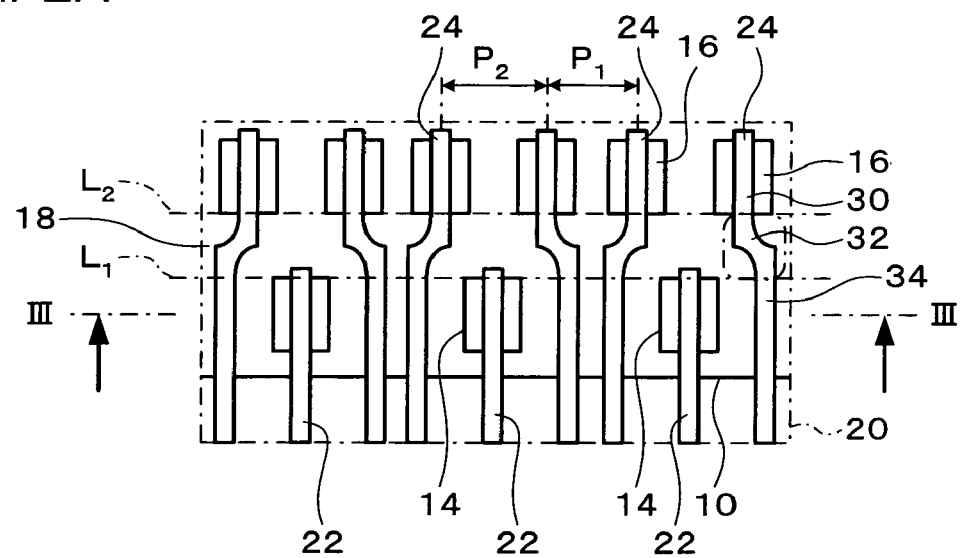
FIG. 2A is an expanded view of the portion of the semiconductor device of FIG. 1 surrounded by a dashed line and FIG. 2B is an expanded view of a bent portion.
Figure 3:
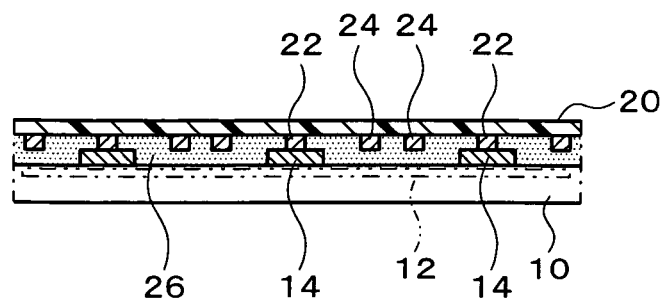
FIG. 3 is a section taken along the line III—III of FIG. 2A.

A semiconductor device in accordance with one embodiment of the present invention is shown in FIG. 1. An expanded view of the portion of the semiconductor device surrounded by a dotted line in FIG. 1 is shown in FIG. 2A, and a section taken along the line III—III of FIG. 2A is shown in FIG. 3.

The semiconductor device has a semiconductor chip 10. The semiconductor chip 10 could be of a shape having rectangular surfaces (a rectangular solid shape). Integrated circuitry 12 is formed on the semiconductor chip 10. A passivation film (electrically insulating film) that is not shown in the figure is formed to cover the integrated circuitry 12.

The semiconductor chip 10 has a first group of electrodes 14 aligned along a first straight line $L_1$. The first group of electrodes 14 is arranged in one line. The first straight line $L_1$ could be a straight line that is parallel on one edge of the semiconductor chip 10 (such as a long edge of a rectangular surface thereof). The first group of electrodes 14 could also be arranged between the first straight line $L_1$ and an edge of the semiconductor chip 10. The first group of electrodes 14 could also be arranged at a uniform pitch.

The semiconductor chip 10 has a second group of electrodes 16 aligned along a second straight line $L_2$. The second group of electrodes 16 is arranged in one line. The second straight line $L_2$ could be a straight line that is parallel to one edge of the semiconductor chip 10 (such as a long edge of a rectangular surface thereof). The second straight line $L_2$ could be positioned closer to the center of the semiconductor chip 10 than the first straight line $L_1$. A pair of regions could be delimited by the second straight line $L_2$, with the second group of electrodes 16 being arranged on the side thereof that is closer to the center of the semiconductor chip 10. The second group of electrodes 16 could also be arranged at an uneven pitch. For example, the second group of electrodes 16 could be arranged in such a manner that the pitch between adjacent electrodes is $P_1$ or $P_2$ (where $P_1 < P_2$), as shown in FIG. 2A. If the second group of electrodes 16 is divided into sections of at least two electrodes each (two in FIG. 2A), the pitch within each section of two or more electrodes is $P_1$ and the pitch between electrodes in adjacent sections of two or more electrodes is $P_2$.

The first and second straight lines $L_1$ and $L_2$ extend parallel to one another. The electrodes 14 and 16 of the first and second groups are disposed on either side of a region 18 between the first and second straight lines $L_1$ and $L_2$. Each of the electrodes 14 and 16 of the first and second groups could be a pad and a bump provided thereon, and they could be formed of a metal such as gold or copper. The electrodes 14 and 16 of the first and second groups are connected electrically to the interior of the semiconductor chip 10, and at least two of the electrodes 14 and 16 of the first and second groups (either all the electrodes or a plurality thereof that is not all of the electrodes) are connected electrically to the integrated circuitry 12. The electrodes 14 and 16 of the first and second groups could be formed so as to be exposed from the passivation film (not shown in the figures).

The semiconductor device has a substrate 20. The substrate 20 could be of a film or a plate form. The substrate 20 is formed of a material that has a higher coefficient of thermal expansion (such as a linear coefficient of expansion) than that of the semiconductor chip 10. The substrate 20 could also have a low level of thermal radiation due to having a lower thermal conductivity ratio than the semiconductor chip 10. The substrate 20 could be formed of a resin such as a polyimide resin, or it could be formed of a compound material of an organic material such as a resin and an inorganic material.

The semiconductor chip 10 is mounted on the substrate 20. The packaging form of the semiconductor chip 10 could be chip-on-film (COF). The surface of the semiconductor chip 10 that has the electrodes 14 and 16 of the first and second groups faces the substrate 20.

A first group of leads 22 is formed on the substrate 20. The first group of leads 22 (portions thereof) faces the first group of electrodes 14 (portions thereof) and could be bonded thereto. The bond is not limited to just a bond formed by mutual crystallization of the materials; it also includes a bond formed by interposing electrically conductive particles therebetween. The first group of leads 22 extends in a direction that crosses (such as orthogonally) the first straight line $L_1$ that acts as a reference arranging the first group of electrodes 14. The first group of leads 22 is drawn out in the direction away from the second group of electrodes 16 (or the second straight line $L_2$).

A second group of leads 24 is formed on the substrate 20. Each of the second group of leads (a first portion 30 thereof, by way of example) faces one of the second group of electrodes 16 (a portion thereof), and could be bonded thereto. The bond is not limited to just a bond formed by mutual crystallization of the materials; it also includes a bond formed by interposing electrically conductive particles therebetween. The second group of leads 24 extends in a direction that crosses (such as orthogonally) the second straight line $L_2$ that acts as a reference linking the second group of electrodes 16. The second group of leads 24 are drawn out from the second group of electrodes 16 in the direction that is closer to the first straight line $L_1$, to cross the first straight line $L_1$.

Each of the second group of leads 24 is drawn out so as to pass between the first group of electrodes 14 (or the first group of leads 22). Specifically, the configuration is such that two or more of the leads 24 of the second group (two in FIG. 2A) pass between adjacent pairs of the electrodes 14.

Figure 2B:
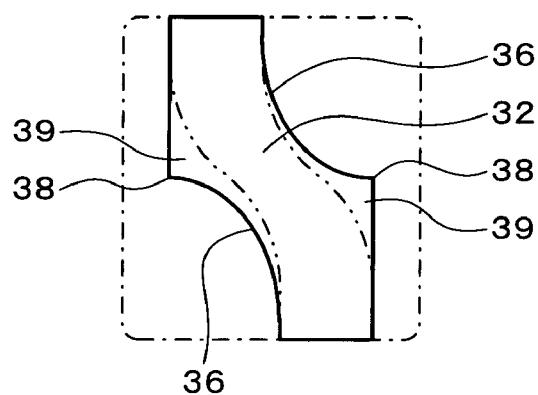

Each of the second group of leads 24 has a bent portion 32. The bent portion 32 could be formed so as to be bent within the region 18 between the first and second straight lines $L_1$ and $L_2$. An expanded view of the bent portion 32 is shown in FIG. 2B. Contours 36 on the inner sides of the bends of the bent portion 32 are formed to draw a curve. The bent portion 32 shown in FIG. 2B is bent into an S-shaped form. In this case, there are bent portions 32 at two mutually opposite sides of the bent portion 32, on the inner sides of the bends thereof. With this embodiment, since each of the second group of leads 24 is bent, it is easy for that bent portion 32 to bend even further. However, since the bent portion 32 has contours on the inner sides of the bends thereof that draw curves, it is difficult for local stress concentrations to form, making it even more possible to prevent breakages.

Each of the second group of leads 24 could be formed to be in a straight line (not bent) by design (before bonding to the electrode 16), except for the portion thereof within the region 18 between the first and second straight lines $L_1$ and $L_2$. For example, the first and second portions 30 and 34 could be straight portions. The bent portion 32 could also comprise a portion that is wider than the first and second portions (for example, the straight portions) 30 and 34. In other words, the portion delimited by dot-dot-dash lines in FIG. 2B could be of the same width as the first and second portions (for example, the straight portions) 30 and 34, and the jutting portion 39 further comprises jutting portions 39. The contour of each jutting portion 39 could comprise an angle. The bent portion 32 could also be formed in such a manner that a contour 38 on the outer side of each bend thereof draws an angle.

In FIG. 2A, the lead 24 of the second group that is in the vicinity of the right-hand side of each of the first group of leads 22 is bent and drawn out in the right-hand direction of the semiconductor chip 10 (see FIG. 1). Generally speaking, each of the second group of leads 24 is bent and drawn out toward the closer edge portion of the semiconductor chip 10, in the region 18 between the first and second straight lines $L_1$ and $L_2$, in the vicinity of each of the first group of leads 22 (in the vicinity of the closer of the two edge portions of the semiconductor chip 10, in the direction along the first and second straight lines $L_1$ and $L_2$). The outermost pair of leads of at least two leads 24 of the second group (two leads 24 in the example of FIG. 2A) are bent and drawn out in mutually approaching directions in the region 18 between the first and second straight lines $L_1$ and $L_2$.

At least one of group of the first and second groups of leads 22 and 24 is formed of a metal such as copper. All of the first group of leads 22 (or the second group of leads 24) could be attached to the substrate 20, or at least portions thereof that overlap the semiconductor chip 10 could be attached to the substrate 20. Such attachment includes a direct attachment to the substrate 20, as well as an attachment with an adhesive.

As shown in FIG. 3, a resin (underfill material or adhesive) 26 could be provided between the semiconductor chip 10 and the substrate 20. The resin 26 could press the electrodes 14 and 16 of the first and second groups and the first and second leads 22 and 24 together by the force of shrinkage thereof. The resin 26 could also distribute or absorb any stresses generated by differences in thermal expansion between the semiconductor chip 10 and the substrate 20. If the second group of leads 24 were bent in such a fashion they had no angles, a precursor (liquid or paste) of the resin 26 exhibits good flowability or filling capability when the resin 26 is provided.

The description now turns to a method of fabricating a semiconductor device in accordance with this embodiment. In this embodiment, the previously described semiconductor chip 10 and substrate 20 are prepared. As shown in FIG. 2A, each of the second group of leads 24 comprises the first portion (such as a straight portion) 30, the bent portion 32 extending from the first portion 30, and a second portion (such as a straight portion) 34 extending from the bent portion 32. At least the second portion 34 (or the entirety) of each of the second group of leads 24 is attached to the substrate 20 (either indirectly by an adhesive or directly, by way of example). The characteristic of this is that the lead 24 is already present before the steps of bonding and heating that will be described later. A pair of the outermost leads 24 among two or more of the second group of leads 24 may be bent in the bent portion 32 from the first portion 30 toward the second portion 34 in the direction in which the pair of leads 24 comes closer.

In this embodiment, the semiconductor chip 10 and substrate 20 are heated. The objective of the heating could be to harden the thermosetting adhesive that bonds together the semiconductor chip 10 and the substrate 20, or to bond together the electrodes 14 and 16 of the first and second groups and the first and second leads 22 and 24, or both. The semiconductor chip 10 and the substrate 20 expand during the heating.

In this embodiment, each of the first group of electrodes 14 (a portion thereof) is bonded to the corresponding one of the first group of leads 22 (a portion thereof). Each of the electrodes 16 of the second group (a portion thereof) is bonded to the first portion 30 of the corresponding lead 24 of the second group (see FIG. 2A. This bonding could be done while the assembly is being heated. Alternatively, preliminary heating could be done before the bonding, and the bonding could be done while the main heating is done.

During the bonding, the first group of leads 22 are disposed in such a manner as to be drawn out in the opposite direction from the second group of electrodes 16 from the bond portions of the first group of electrodes 14. The first portion 30 of each of the second group of leads 24 faces the corresponding electrode 16 of the second group. The bent portion 32 of each of the second group of leads 24 is disposed in the region 18 between the first and second straight lines $L_1$ and $L_2$. The second portion 34 of each of the second group of leads 24 passes between the first group of electrodes 14.

During the bonding, the bent portion 32 of each of the second group of leads 24 in the vicinity of a lead 22 of the first group of leads is bent in the direction towards the closer of the two side edges of the semiconductor chip 10 (to the right in FIGS. 1 and 2A), from the first portion 30 towards the second portion 34, in the direction of the closer of the two side edges of the semiconductor chip 10 in the direction along the first and second straight lines $L_1$ and $L_2$ (to the right in FIGS. 1 and 2A). Two or more of the leads 24 of the second group are disposed so as to pass between neighboring pairs of the electrodes 14 of the first group of electrodes. The rest of the details of the configuration are as described above.

A semiconductor device in accordance with this embodiment can be fabricated by the method comprising the above processes. In addition, if there is a difference in the rates of thermal expansion (such as linear thermal expansion rates) between the semiconductor chip 10 and the substrate 20, the method of fabricating the semiconductor device could also comprise a step of causing the semiconductor chip 10 and the substrate 20 to cool while also allowing them to shrink.

The process of allowing the semiconductor chip and the substrate to cool while shrinking, in accordance with one embodiment of the present invention, will now be described with reference to FIGS. 4 and 5. The substrate 20 is formed of a material having a linear expansion rate that is greater than that of the semiconductor chip 10. For example, the substrate 20 could be formed of a resin and the semiconductor chip 10 could be formed mainly of silicon. The semiconductor chip 10 also has a cooling rate that is higher than that of the substrate 20.

In this embodiment, the semiconductor chip 10 shrinks at a rate that is greater than that of the substrate 20. When the cooling rate of the semiconductor chip 10 is higher than that of the substrate 20, this shrinkage could be generated by the semiconductor chip 10 radiating heat (or cooling) before the substrate 20.

Figure 4:
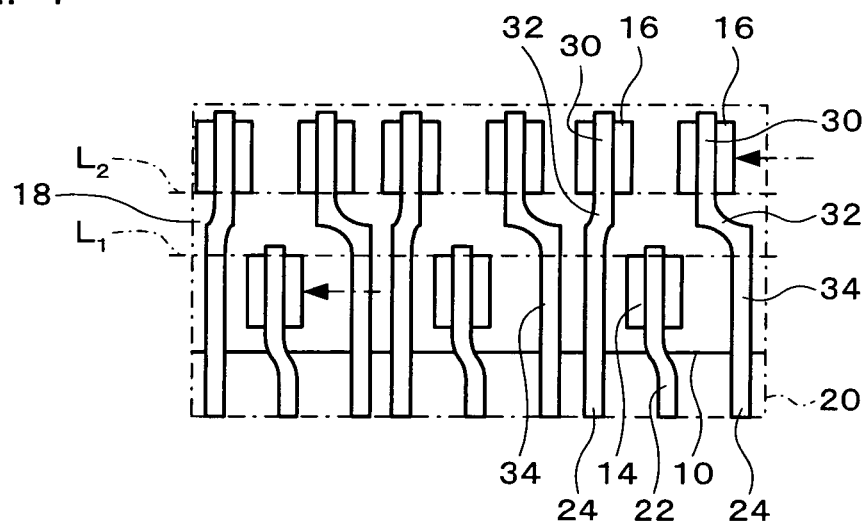
FIG. 4 is illustrative of a process of allowing cooling and also shrinkage in the semiconductor chip and substrate of one embodiment of the present invention.

As shown in FIG. 4, a force is applied by the force of shrinkage to the bent portion 32 in the direction of shrinkage, through the first portion 30 connected to the corresponding electrode 16 of the second group, causing deformation of the bent portion 32. The force in the shrinkage direction is a force acting towards the center of the semiconductor chip 10 from both side edges thereof. In other words, a force is applied on the first portion 30 in the direction toward the center of the semiconductor chip 10, from the edge portion of the semiconductor chip 10 (specifically, from the nearer edge portion of the two side edges of the semiconductor chip 10 in the direction along the first and second straight lines $L_1$ and $L_2$). The first portion 30 therefore moves from the edge portion of the semiconductor chip 10 toward the center thereof, with respect to the second portion 34 that is connected via the bent portion 32, and the bent portion 32 deforms accordingly.

In FIG. 4, each of the second group of leads 24 that is in the vicinity of the right side of a lead of the first group of leads 22 (generally speaking, the lead 22 in the vicinity of the closer of the two side edges of the semiconductor chip 10 in the direction along the first and second straight lines $L_1$ and $L_2$) deforms so that the bend thereof is greater.

Each of the second group of leads 24 that is in the vicinity of the left side of a lead of the first group of leads (generally speaking, the lead 22 in the vicinity of the farther edge portion direction of the two side edges of the semiconductor chip 10 in the direction along the first and second straight lines $L_1$ and $L_2$) deforms so that the bend thereof is less.

Similarly, the force in the shrinkage direction is applied to a portion extending from the bond portion of each of the first group of leads 22, through the bond portion with the corresponding electrode of the first group of electrodes 14. Each of the first group of leads 22 bends from the corresponding electrode in the direction of the edge portion of the semiconductor chip 10 (strictly speaking, the closer of the two side portions of the semiconductor chip 10 in the direction along the first and second straight lines $L_1$ and $L_2$).

The substrate 20 is then allowed to shrink at a rate that is greater than that of the semiconductor chip 10. If the cooling rate of the semiconductor chip 10 is greater than that of the substrate 20, this shrinking could be done by allowing the semiconductor chip 10 and the substrate 20 to lose heat (or cool), so that the shrinkage is generated after the semiconductor chip 10 has shrunk previously.

Figure 5:
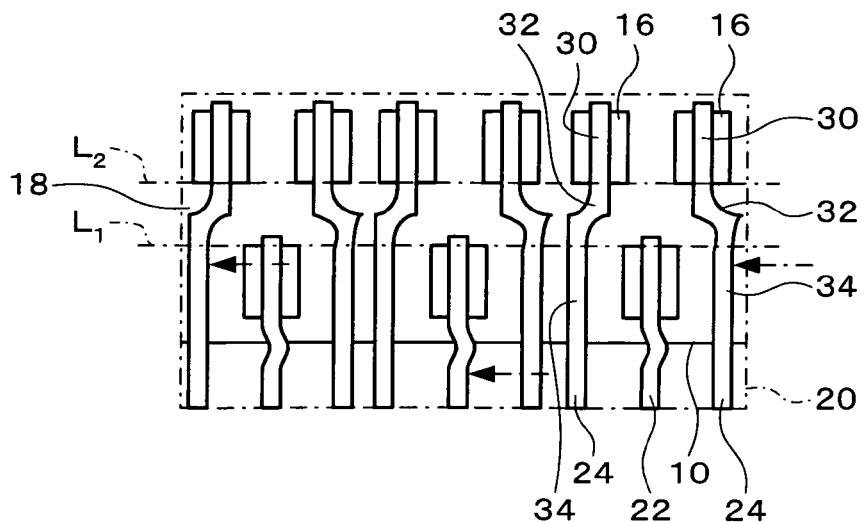
FIG. 5 is illustrative of a process of allowing cooling and also shrinkage in the semiconductor chip and substrate of one embodiment of the present invention.

As shown in FIG. 5, the force of shrinkage causes a force in the shrinkage direction to be applied to the second portion 34 affixed to the substrate 20, deforming the bent portion 32. The force in the shrinkage direction is a force from the two side edges of the substrate 20 toward the center thereof. In other words, a force is applied to the second portion 34 in the direction toward the center of the substrate 20, from the edge portion of the substrate 20 (specifically, the closer of the two side portions of the substrate 20 in the direction along the first and second straight lines $L_1$ and $L_2$). Since the second portion 34 therefore moves in the direction from the edge of the substrate 20 towards the center thereof, with respect to the first portion 30 that is connected thereto by the bent portion 32, the bent portion 32 deforms accordingly.

In FIG. 5, the bent portion 32 of each of the second group of leads 24 that is in the vicinity of the right-hand side of each of the first group of leads 22 (generally speaking, in the vicinity of the closer of the two edge portions of the semiconductor chip 10, in the direction along the first and second straight lines $L_1$ and $L_2$) is deformed to be bent in the opposite direction. As a result, a convex portion (or protrusion) could be formed to the right (generally speaking, in the direction toward the closer of the two side edges of the substrate 20 in the direction along the first and second straight lines $L_1$ and $L_2$) of each of the first group of leads 22.

Each of the second group of leads 24 that is in the vicinity of the left-hand side of the each of the first group of leads 22 (generally speaking, in the vicinity of the further of the two edge portions of the semiconductor chip 10, in the direction along the first and second straight lines $L_1$ and $L_2$) is deformed so that the bend thereof becomes greater, as shown in FIG. 5.

Similarly, the force of shrinkage causes the application of a force in the shrinkage direction on each of the first group of leads 22, through the bond portion with the corresponding one of the first group electrodes 14, to cause deformation thereof. The portion of each of the first group of leads 22 that has already been bent by the previously described processes (see FIG. 4) deform in the opposite direction. As a result, a convex portion (or protrusion) could be formed in the bent portion to the right (generally speaking, in the direction toward the closer of the two side edges of the substrate 20 in the direction along the first and second straight lines $L_1$ and $L_2$) of each of the first group of leads.

A semiconductor device in accordance with the present invention could have the configuration obtained by the above-described processes. The method of fabricating the semiconductor device in accordance with this embodiment could also comprise processes that can be derived from the above description of the semiconductor device. For example, the semiconductor chip 10 could be mounted on the substrate 20 with a gap formed therebetween. Similarly, a resin (such as an underfill material) could be packed between the semiconductor chip 10 and the substrate 20.

Since each of the second group of leads 24 is bent in this embodiment, the bent portion 32 thereof can bend even more readily. Since the bent portions 32 are positioned in the region 18 between the first and second straight lines $L_1$ and $L_2$ and this region 18 is between the electrodes 14 and 16 of the first and second groups, the bent portions 32 do not come into contact with the electrodes 14 and 16 even when the leads 24 bend. This makes it possible to prevent contact between the leads 24 and the electrodes 14 and 16.

VARIANT EXAMPLES

Figure 6:
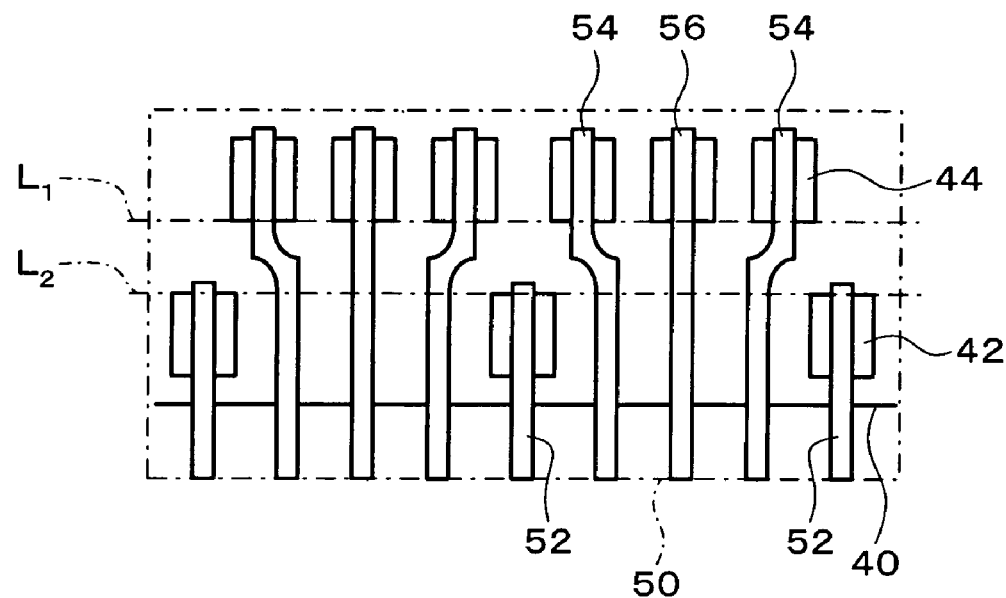
FIG. 6 is illustrative of a first variant example of the semiconductor device in accordance with one embodiment of the present invention.

A first variant example of the semiconductor device in accordance with one embodiment of the present invention is shown in FIG. 6. A semiconductor chip 40 has first and second groups of electrodes 42 and 44 (which correspond to the previously-described electrodes 14 and 16 of the first and second groups). A substrate 50 has first and second groups of leads 52 and 54 (which correspond to the previously-described first and second groups of leads 22 and 24). In this variant example, at least one lead 56 (one in FIG. 6) is arranged between a pair of leads 54 of the second group. The lead 56 could extend in a straight line. In all other points, the semiconductor device of this variant example is equivalent to that of the above-described embodiment.

In this variant example too, the leads 52, 54, and 56 can be allowed to deform, as in the configuration described with reference to FIGS. 4 and 5. Note that the deformation of the lead 56 corresponds to the deformation of the leads 22 in FIGS. 4 and 5.

Figure 7:
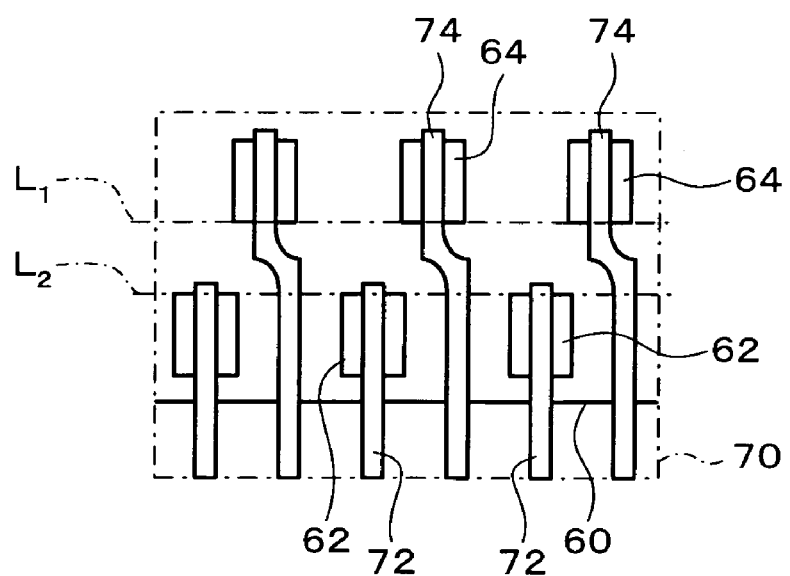
FIG. 7 is illustrative of a second variant example of the semiconductor device in accordance with one embodiment of the present invention.

A second variant example of the semiconductor device in accordance with one embodiment of the present invention is shown in FIG. 7. A semiconductor chip 60 has first and second groups of electrodes 62 and 64 (which correspond to the previously-described electrodes 14 and 16 of the first and second groups). It should be noted that the first and second groups of electrodes 62 and 64 are arranged in a zigzag. A substrate 70 has a first group of leads 72 (which corresponds to the previously-described first group of leads 22).

The substrate 70 also has a second group of leads 74 (which corresponds to the previously-described second group of leads 24). Each lead 74 is arranged between a pair of leads 72 and each lead 72 is arranged between a pair of leads 74. The leads 74 are bent, with details thereof being equivalent to those of the leads 24 described with reference to FIG. 2A. It should be noted that all of the leads 74 of this variant example are bent and drawn out toward the closer of the two side edges of the semiconductor chip 10 in the direction along the first and second straight lines $L_1$ and $L_2$. This point differs from the configuration shown in FIG. 2A in which two leads 24 between pairs of leads 22 approach each other. In all other points, the semiconductor device of this variant example is equivalent to that of the above-described embodiment.

In this variant example too, the leads 72 and 74 can be allowed to deform, as in the configuration described with reference to FIGS. 4 and 5. Note that the deformation of the leads 72 corresponds to the deformation of the leads 22 in FIGS. 4 and 5. The deformation of the leads 74, however, is equivalent to that of the leads 24 in the vicinity of the right-hand side of leads 22 (generally speaking, in the vicinity of the closer of the two side edges of the semiconductor chip 10, in the direction along the first and second straight lines $L_1$ and $L_2$).

Figure 8:
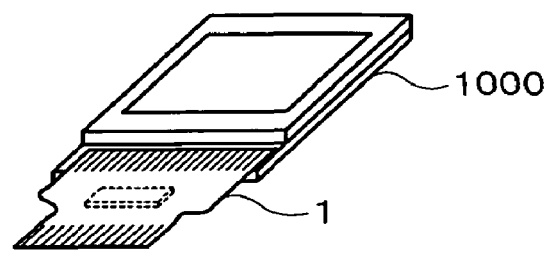
FIG. 8 shows an electronic module to which is attached a semiconductor device in accordance with one embodiment of the present invention.
Figure 9:
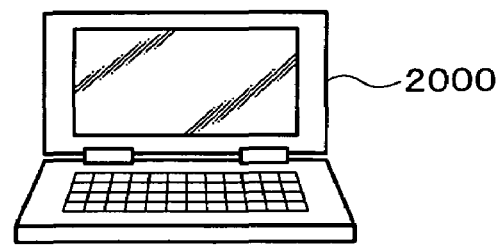
FIG. 9 shows an electronic instrument having a semiconductor device in accordance with one embodiment of the present invention.
Figure 10:
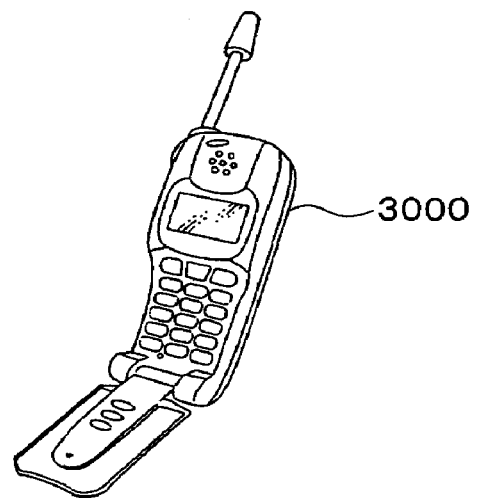
FIG. 10 shows another electronic instrument having a semiconductor device in accordance with one embodiment of the present invention.

An electronic module (such as a liquid crystal module) 1000 on which is mounted a semiconductor device 1 in accordance with the above-described embodiment of the present invention is shown in FIG. 8. A notebook personal computer 2000 shown in FIG. 9 and a portable phone 3000 shown in FIG. 10 are examples of electronic instruments having this semiconductor device.

Although only some embodiments of the present invention have been described in detail above, those skilled in the art will readily appreciate that many modifications are possible in the embodiments without materially departing from the novel teachings and advantages of this invention. Accordingly, all such modifications are intended to be included within scope of this invention.

What is claimed is:

1. A semiconductor device comprising:
   a substrate on which are formed a first group and a second group of leads; and
   a semiconductor chip having a first group and a second group of electrodes, the first group and the second group of electrodes being arranged respectively in first and second regions which sandwich a region between first and second straight lines on the semiconductor chip, the first and second straight lines being parallel to each other,
   wherein the semiconductor chip is mounted on the substrate so that the first group of electrodes faces the first group of leads and the second group of electrodes faces the second group of leads,
   wherein each of the second group of leads has a bent portion, the bent portion being formed so that a contour of an inner side of each of the bent portion draws a curve, and wherein the first group of leads is drawn out in a direction extending away from the second group of electrodes, each of the second group of leads is drawn out so as to pass between the first group of electrodes, and the bent portion is positioned on a portion of the substrate opposed to the region between the first and second straight lines.

2. The semiconductor device as defined in claim 1,
wherein the bent portion is formed so that a contour of an outer side of each bend of the bent portion draws an angle.

3. The semiconductor device as defined in claim 2,
wherein the bent portion is formed between straight portions, and
wherein the bent portion comprises a wide portion which is wider than the width of the straight portions.

4. The semiconductor device as defined in claim 3,
wherein a contour of the wide portion comprises the angle.

5. An electronic module to which is attached the semiconductor device as defined in claim 1.

6. An electronic instrument having the semiconductor device as defined in claim 1.

* * * * *